(12) United States Patent
Sambasivam et al.

(10) Patent No.: US 7,141,452 B2
(45) Date of Patent: Nov. 28, 2006

(54) METHODS OF REDUCING BLEED-OUT OF UNDERFILL AND ADHESIVE MATERIALS

(75) Inventors: Mahesh Sambasivam, Pennington, NJ (US); Drew W. Delaney, Gilbert, AZ (US); Saeed Shojaie, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/725,782

(22) Filed: Dec. 1, 2003

(65) Prior Publication Data
US 2005/0118748 A1     Jun. 2, 2005

(51) Int. Cl.
*H01L 21/48* (2006.01)
(52) U.S. Cl. .................... 438/118; 438/127
(58) Field of Classification Search ................ 438/127
See application file for complete search history.

(56) References Cited

U.S. PATENT DOCUMENTS 5,982,041 A * 11/1999 Mitani et al. ............... 257/783
6,214,635 B1 * 4/2001 Akram et al. ................ 438/51
6,582,993 B1 * 6/2003 Baba et al. ................. 438/118
6,620,649 B1 * 9/2003 Uchida ....................... 438/107
6,759,307 B1 * 7/2004 Yang .......................... 438/455

OTHER PUBLICATIONS

INTERTRONICS Technical Bulletins & Articles from http://www.intertronics.co.uk/general/bulletin.htm, 2 pages.*
Swanson, Peter "Case Histories of Light Curing Adhesives in Electronics Manufacturing", pdf file downloaded from link above at http://www.intertronics.co.uk/general/bulletin.htm, 14 pages.*
Swanson, Peter "Advances in Photo Curing Adhesives and Coatings Lead to Process and Quality Benefits in Electronics Manufacturing", html link at http://www.intertronics.co.uk/general/bulletin.htm, 13 pages.*

* cited by examiner

*Primary Examiner*—Evan Pert
(74) *Attorney, Agent, or Firm*—Robert G. Winkle

(57) ABSTRACT

Methods of forming microelectronic devices by disposing a radiation curable underfill material or adhesive material between a substrate and a microelectronic die, and exposing any radiation curable material which bleeds-out therefrom to radiation before or immediately after disposition, thereby reducing the extent of material bleed-out.

14 Claims, 11 Drawing Sheets

METHODS OF REDUCING BLEED-OUT OF UNDERFILL AND ADHESIVE MATERIALS

BACKGROUND OF THE INVENTION

1. Field of the Invention

The present invention relates to methods for disposing underfill and adhesive materials during microelectronic package fabrication. In particular, the present invention relates to utilizing radiation curable materials, which, when exposed to such radiation, prevents excessive bleed-out during the fabrication of the microelectronic packages.

2. State of the Art

In the field of electronic systems, there is continuous competitive pressure to increase the performance of components while reducing production costs. This competitive pressure is particularly intense in the fabrication of microelectronic devices, where each new generation must provide increased performance while also reducing the size or footprint of the microelectronic device.

As shown in FIG. 17, an exemplary microelectronic package includes a microelectronic die 202 that is mounted on a substrate 204, such as an interposer, a motherboard, and the like, which functionally connects the microelectronic die 202 through a hierarchy of electrically conductive paths (not shown) to the other electronic components (not shown). The illustrated method for electronically mounting the microelectronic die 202 to the substrate 204 is called flip chip bonding. In this mounting method, electrically conductive terminals or pads 206 on an active surface 208 of the microelectronic die 202 are attached directly to corresponding lands 212 on a surface 214 of the substrate 204 using reflowable solder bumps or balls 216, thermocompression bonding, or any other known methods of flip chip attachment.

To enhance the reliability of the solder bumps 216 connecting the microelectronic die pads 206 and the substrate lands 212, an underfill material is used to mechanically and physically reinforce them. In a known method of underfill encapsulation shown in FIGS. 18 and 19, a low viscosity underfill material 222, such as an epoxy material, is dispensed from at least one dispensing needle 230 along at least one edge 224 (usually one or two edges) of the microelectronic die 202. The underfill material 222 is drawn between the microelectronic die 202 and the substrate 204 by capillary action (in generally the x-direction shown as arrows 240 in FIG. 19), and the underfill material 222 is subsequently cured (hardened) using heat, which forms the microelectronic package 200 shown in FIG. 20.

With the pressure to decrease the size of the microelectronic packages, bump pitch 226 and bump height 228 has decreased. Thus, it has become successively more difficult to obtain adequate underfill material dispersion without continuously decreasing the viscosity of the underfill material 222 or improving its wettability properties. However, decreasing the viscosity and/or improving the wettability of the underfill material 222 results in the underfill material 222 bleeding out and substantially surrounding the microelectronic die 202, as shown in FIGS. 20 and 21. This bleed-out area beyond the edges 224 of the microelectronic die 202 is generally referred to as a "bleed-out tongue" 232 having a varying width 234. The bleed-out tongue 232 is a problem because it can cover and contaminate valuable surface area on the substrate 204.

For example, as shown in FIG. 22, an exemplary stacked package 250 includes a microelectronic die 202 that is mounted on a substrate 204 with a plurality of solder bumps 216 extending between microelectronic die pads 206 and substrate lands 212, as discussed with regard to FIG. 17. A second microelectronic die 242 is attached by its back surface 244 to a back surface 246 of the microelectronic die 202 with a layer of adhesive 248. A plurality of wirebonds 252 makes electrical contact between lands 254 on an active surface 256 of the second microelectronic die 242 and wirebond lands 258 on the substrate 204. The substrate wirebond lands 258 are placed as close to the microelectronic die 202 as possible in order to conserve the valuable surface area in the substrate 204 and also meet chip scale package small form factor requirements. However, FIG. 22 illustrates the stacked package 250 without an underfill material. As shown in FIG. 23, the underfill material 222 is disposed before the wirebonds 252 (see FIG. 22) are attached. However, the bleed-out tongue 232 can have a width 234, which covers the wirebond lands 258. Thus, at least the portion of the bleed-out tongue 232 covering the wirebond lands 258 would have to be removed in order to attach the wirebonds 252 (see FIG. 22). This, of course, is difficult and may reduce the reliability of the microelectronic device, as well as increasing the package cost.

As shown in FIG. 24, the bleed-out problem also exists when the second microelectronic die 242 of FIG. 23 is directly attached by its back surface 244 to the substrate 204 rather than being stacked. An adhesive material 262 is disposed between the substrate 204 and the second microelectronic die 242. When the second microelectronic die 242 is positioned and placed on the substrate 204, the adhesive material 262 can bleed-out and cover the wirebond lands 258, which would have to be removed in order to attach the wirebonds 252 (see FIG. 22). This, again, is difficult and may reduce the reliability of the microelectronic device, as well as increasing the package cost.

Therefore, it would be advantageous to develop techniques to effectively dispose underfill and adhesive materials between a microelectronic die and the substrate while substantially reducing the bleed-out.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
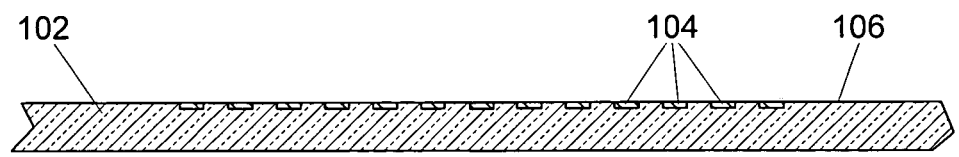
FIG. 1 is a side cross-sectional view of a substrate, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to forming a microelectronic device by disposing a radiation curable underfill material or adhesive material between a substrate and a microelectronic die, and exposing any of the radiation curable material which bleeds-out therefrom to radiation before or immediately after disposition, thereby reducing the extent of the material bleed-out.

FIGS. 1–5 illustrate a method of forming an exemplary microelectronic device. FIG. 1 illustrates a substrate 102, such as a motherboard, interposer, or the like, including a plurality of lands 104 disposed on a first surface 106 thereof. The substrate lands 104 are connected to a hierarchy of electrical conductive paths (not shown) to other electronic components (not shown) to provide electrical connection thereto with a subsequently mounted microelectronic die, as is understood to those skilled in the art.

Figure 2:
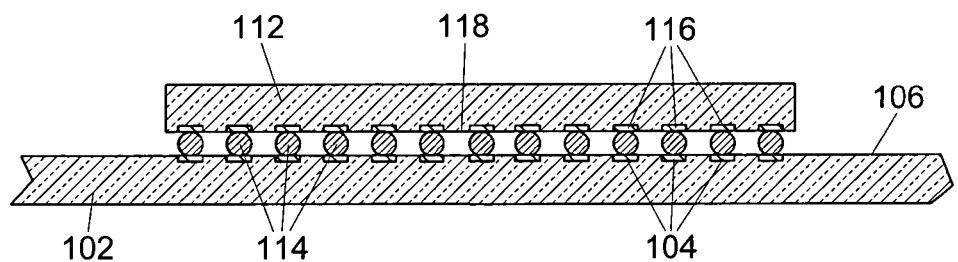
FIG. 2 is a side cross-sectional view of the substrate of FIG. 1 having a first microelectronic die electrically coupled thereto, according to the present invention.

As shown in FIG. 2, a microelectronic die 112 is electronically mounted on the substrate 102. The microelectronic die 112 can include, but is not limited to, a central processing units (CPUs), chipsets, memory devices, ASICs, and the like. The illustrated method for electronically mounting the microelectronic die 112 to the substrate 102 is the attachment methods previously discussed, but is not limited thereto. Electrically conductive terminals or lands 116 on an active surface 118 of the microelectronic die 112 are attached directly to the corresponding substrate lands 104 using conductive interconnects, for example bumps or balls 114, such as leaded or lead-free reflowable solder balls, leaded or lead-free solder paste, metal filled epoxy, and the like.

Figure 3:
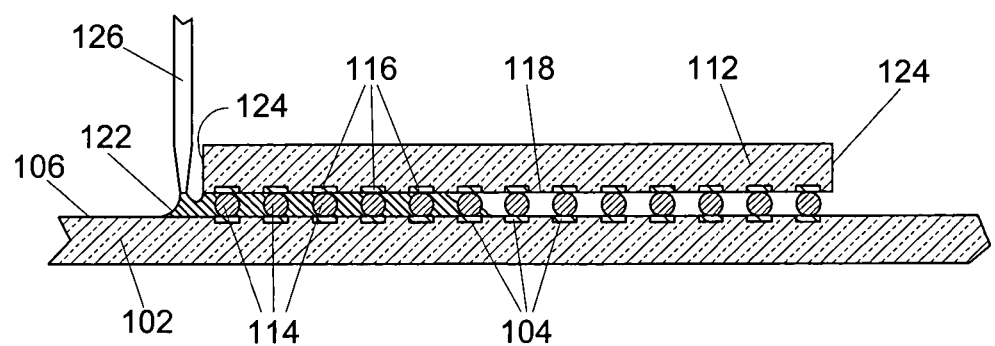
FIG. 3 is a side cross-sectional view of the structure of FIG. 2, wherein a dispensing needle disposes an underfill material between the substrate, according to the present invention.
Figure 4:
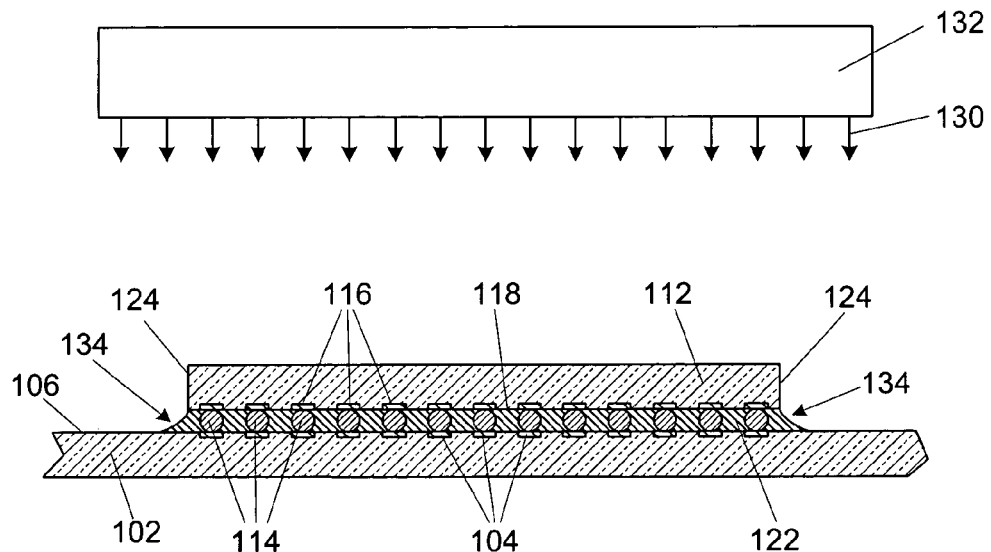
FIG. 4 is a side cross-sectional view of the structure of FIG. 3, after the underfill material has been disposed in the presence of a radiation source, according to the present invention.
Figure 5:
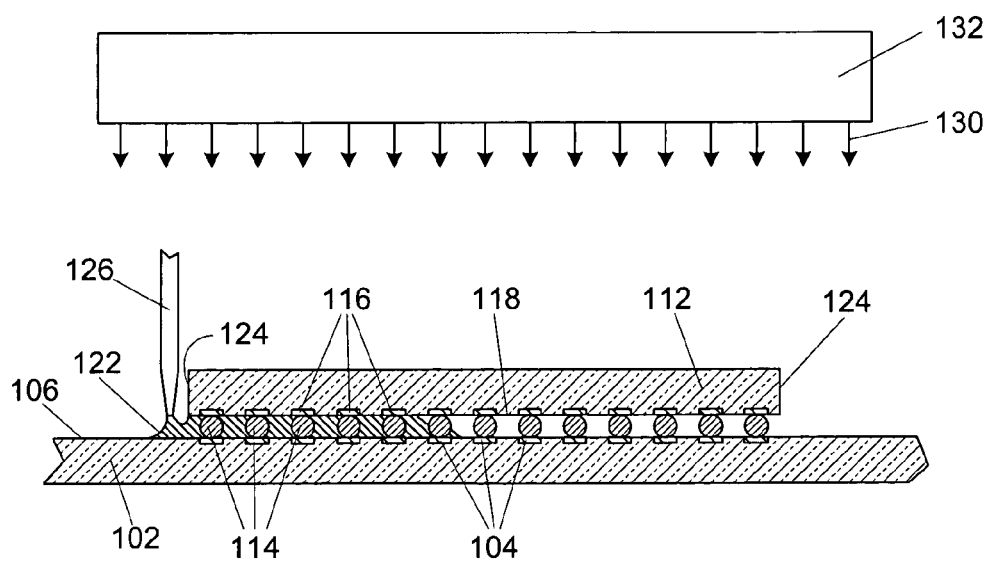
FIG. 5 is a side cross-sectional view of the structure of FIG. 2, wherein a dispensing needle disposes an underfill material between the substrate and the first microelectronic die in the presence of a radiation source, according to the present invention.
Figure 7:
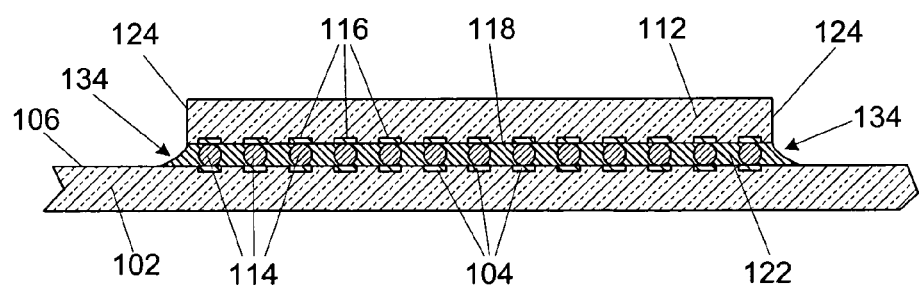
FIG. 7 is a side cross-sectional view of the substrate of FIG. 6 having a first microelectronic die electrically coupled thereto, according to the present invention.
Figure 8:
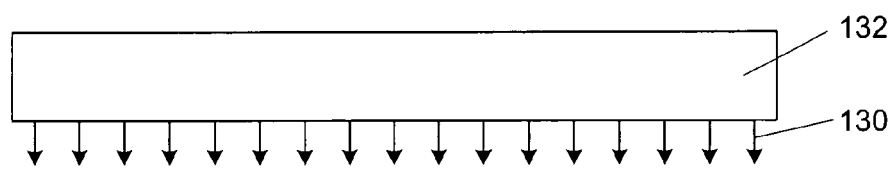
FIG. 8 is a side cross-sectional view of the structure of FIG. 7 exposed to radiation form a radiation source, according to the present invention.
Figure 8:
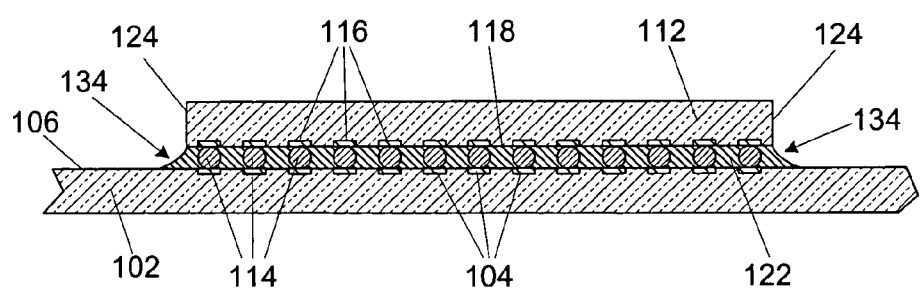

A radiation curable underfill material 122 is dispensed from at least one dispensing device 126 along at least one edge 124 of the microelectronic die 112, as shown in FIG. 3. The radiation curable underfill material 122 is drawn between the microelectronic die 112 and the substrate 102 by capillary action (in generally the x-direction shown as arrows 240 in FIG. 14). As shown in FIG. 4, immediately after dispensing the radiation curable underfill material 122, the substrate 102 and the microelectronic die 112 are exposed to radiation (illustrated as arrows 130) emanating from a radiation source 132, wherein the radiation 130 is capable of curing the radiation curable underfill material 122. Thus, any radiation curable underfill material 122, which extends beyond the microelectronic die edge 124, will be exposed to the radiation 130. The exposed material begins to at least partially cure or gel which prevents further flow of the radiation curable underfill material 122 resulting in a minimal bleed-out tongue 134. It is, of course, understood that depending on the selection of the radiation curable underfill material 122, the exposure to radiation from the radiation source 132 could occur during the dispensing of such radiation curable underfill material 122, as shown in FIG. 5. Furthermore, it is understood that the radiation curable underfill material 122 can be disposed on the substrate first surface 106 (see FIG. 6) followed by attachment for the microelectronic die 122 (see FIG. 7), which is followed by exposure to radiation by from the radiation source 132 (see FIG. 8).

The radiation curable underfill material 122 may include, but is not limited to the following, epoxies, acrylates, silicones, urethane acrylates, cyanoacrylates, bismaleimides, and the like. The radiation may include, but is not limited to, ultraviolet light, ultraviolet-visible light (e. g. , near ultraviolet), or electron-beam (E-beam).

In one embodiment, the radiation curable underfill material 122 is an epoxy adhesive, for example, Loctite® 3338 from Loctite Corporation, Rocky Hill, Conn., USA, which is dispensed on the substrate first surface 106. The microelectronic die 112 is placed on top of the radiation curable underfill material 122 with certain pressure to wet the microelectronic die active surface 118 and spread the radiation curable underfill material 122. Immediately after the microelectronic die 112 is attached, the construction is exposed to ultraviolet light source such as a Fusion Model LC-6B Benchtop Conveyor from Fusion UV Systems, Inc of Gaithersburg, Md., USA. The typical ultraviolet cure conditions are an exposure time of about 30 seconds to a lamp source Fusion "D" bulb, Hg arc, or a metal halide bulb with an irradiance of between about 50 and 100 mW/cm$^2$. The wavelength of the ultraviolet light is between about 310 and 365 nm. A post-cure of between about 30 and 60 minutes at about 100° C. can be applied to fully cure the radiation curable underfill material 122.

In another embodiment, after the microelectronic die 112 is attached to the substrate 102 with the conductive interconnects 114, a radiation curable underfill material 122, such as EMCAST 1700 series from Electronic Materials, Inc. of Breckenridge, Colo., USA, is dispensed on the substrate 102 next to the microelectronic die 112 to allow capillary action to pull the material between the microelectronic die 112 and substrate 102 filling the air gap. Immediately after the underfill dispense and gap filling, the construction is exposed to ultraviolet light source such as a Jenton® UV spot source or conveyor system available from Jenton International, Hampshire, United Kingdom. The typical ultraviolet cure conditions are an exposure time of between about 30 and 180 seconds with an irradiance of between about 75 and 200 mW/cm$^2$. The wavelength of the ultraviolet light is between about 310 and 365 nm. A post-cure of between about 30 and 60 minutes at about 100° C. can be applied to fully cure the radiation curable underfill material 122.

Figure 9:
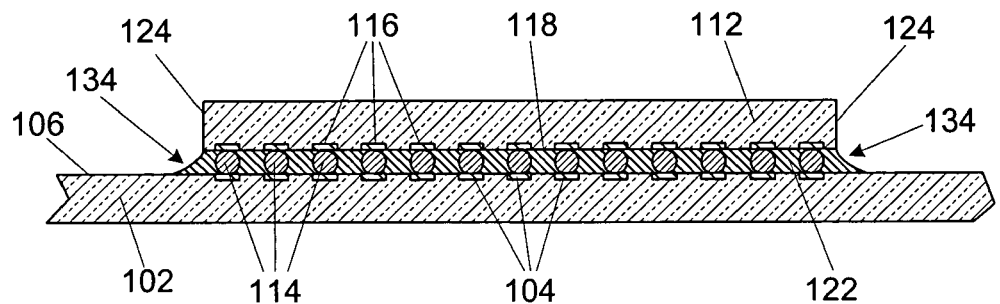
FIG. 9 is a side cross-sectional view of the structure of FIG. 8, after curing of the underfill material, according to the present invention.

The radiation curable underfill material 122 is then cured (usually heated to solidify the underfill material), resulting in the microelectronic package 138, as shown in FIG. 9. It is preferred that the conductive bumps or balls 114 are reflowed for attachment prior to dispensing the radiation curable underfill material 122. However, it is understood that the reflow (if necessary) of conductive bumps or balls 114 for the attachment of the microelectronic die 112 would also be achieved simultaneously with the curing of the radiation curable underfill material 122.

Figure 10:
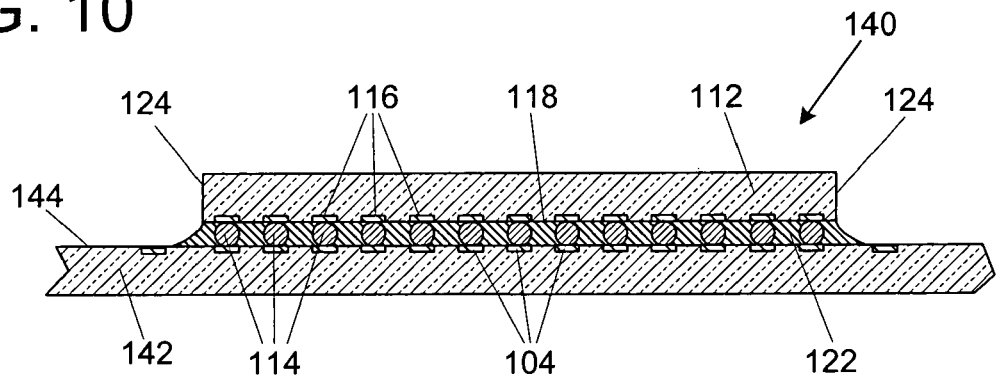
FIG. 10 is a side cross-sectional view of an intermediate structure similar to the structure of FIG. 9, according to the present invention.

FIGS. 10–13 illustrate the formation of a stacked microelectronic device. FIG. 10 illustrates an intermediate structure 140 comprising a substrate 142 (similar to the substrate 102 of FIG. 1) and the microelectronic die 112 attached to an active surface 144 thereof, as well as the radiation curable underfill material 122 disposed between the substrate 142 and the microelectronic die 112 formed and cured as described in FIGS. 3–6. The substrate 142 also includes at least one wirebond land 146 on the active surface 144 thereof. The minimization of the bleed-out tongue 134, as discussed and shown in FIG. 4, prevents it from interfering with the wirebond lands 146, thereby allowing placement of the wirebond lands 146 close to the microelectronic die 112.

Figure 11:
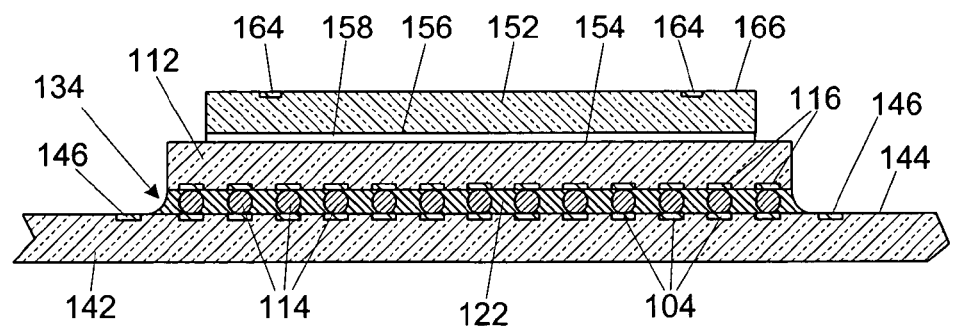
FIG. 11 is a side cross-sectional view of the structure of FIG. 10 having a second microelectronic attached by its back surface to a back surface of the first microelectronic die, according to the present invention.
Figure 12:
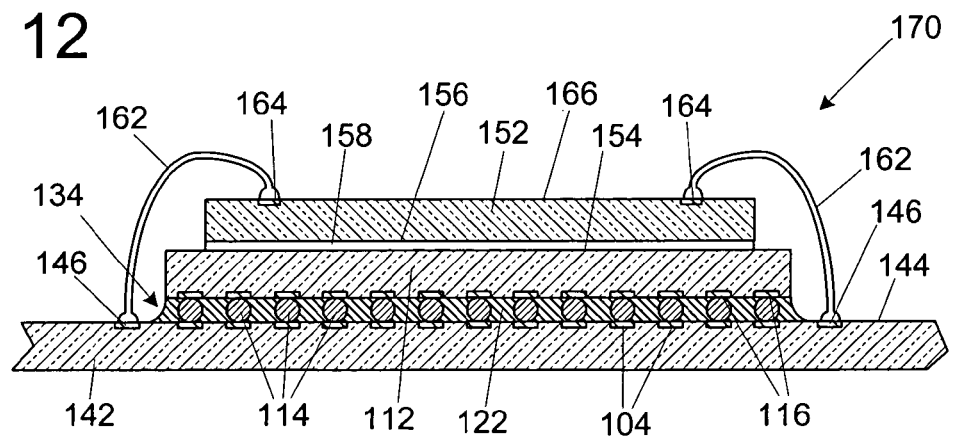
FIG. 12 is a side cross-sectional view of the structure of FIG. 1, wherein the second microelectronic is electrically coupled to the substrate, according to the present invention.

FIG. 11 illustrates a second microelectronic die 152 attached by its back surface 156 to a back surface 154 of the microelectronic die 112, which opposes the microelectronic die active surface 118, with a layer of adhesive 158. The second microelectronic die 152 can include, but is not limited to, a central processing units (CPUs), chipsets, memory devices, ASICs, and the like. As shown in FIG. 12, at least one wirebond 162 makes electrical contact between at least one land 164 on an active surface 166 of the second microelectronic die 152, which opposes the second microelectronic die back surface 154, and at least one wirebond land 146 on the substrate 142 to form the stacked microelectronic device 170. Preferably, the radiation curable underfill material 122 is cured prior to the attachment of the second microelectronic die 152. Furthermore, it is understood that the radiation curable underfill material 122 may be disposed and cured after the attachment of the second microelectronic die 152.

Figure 6:
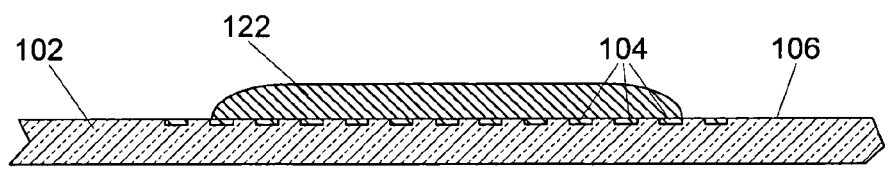
FIG. 6 is a side cross-sectional view of a substrate having an underfill material disposed thereon, according to the present invention.

It is, of course, understood that additional steps and fabrication could be undertaken, including mold/encapsulation of the packages of FIGS. 6 and 12, attachment of heat dissipation devices, and the formation of multi-stack packages.

Figure 13:
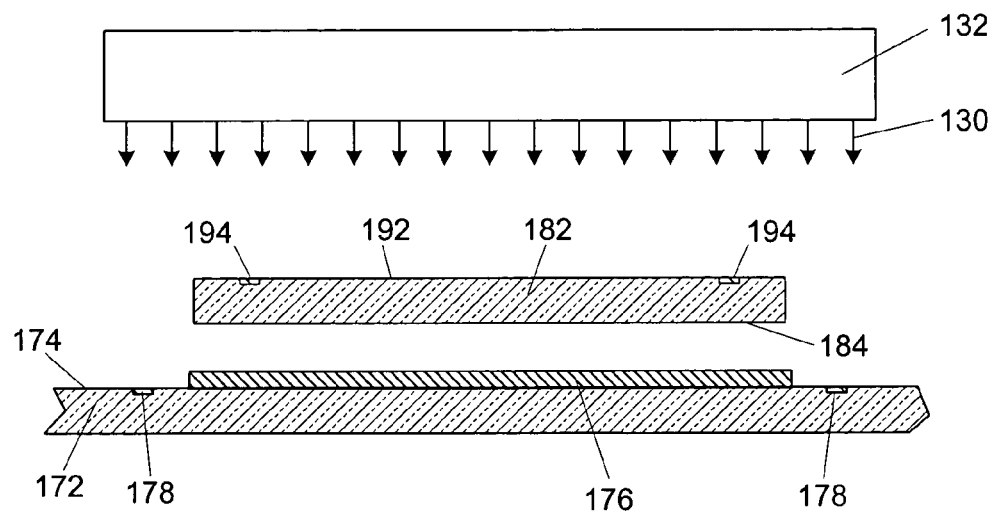
FIG. 13 is a side cross-sectional view of a wirebond microelectronic die position over a substrate, according to the present invention.

As shown in FIGS. 13–16, the present invention would also apply to adhesive application. As shown in FIG. 13, a radiation curable adhesive material 176 is applied to an active surface 174 of a substrate 172, which has a least one wirebond land 178 thereon. A microelectronic device 182 is positioned above the radiation curable adhesive material 176 (see FIG. 13) and placed by its back surface 184 thereon (see FIG. 14). The microelectronic die 182 can include, but is not limited to, a central processing units (CPUs), chipsets, memory devices, ASICs, and the like.

Figure 14:
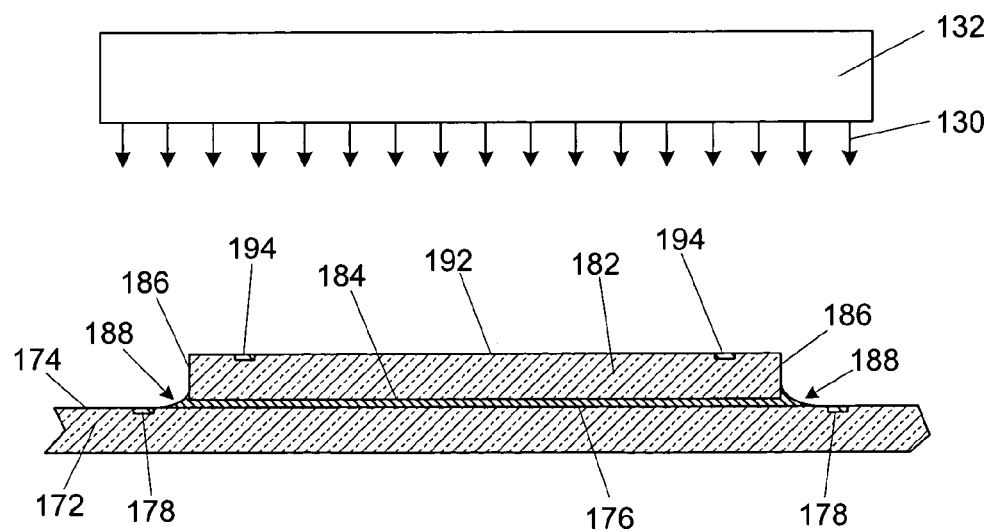
FIG. 14 is a side cross-sectional view of the structure of FIG. 13, wherein the wirebond microelectronic die is attached to the substrate by a layer of adhesive while being exposed to a radiation source, according to the present invention.

During, as shown in FIG. 13, or substantially immediately after, as shown in FIG. 14, the placement of the microelectronic die 182 on the radiation curable adhesive material 176, the substrate 172 and the microelectronic die 182 are exposed to radiation (illustrated as arrows 130) emanating from a radiation source 132, wherein the radiation 130 is capable of curing the radiation curable adhesive material 176. Thus, any radiation curable material 176, which extends beyond an edge 186 of the microelectronic die 182, will be exposed to the radiation 130. The exposed material begins to at least partially cure or gel which prevents further flow of the radiation curable adhesive material 176 resulting in a minimal bleed-out tongue 188. The minimization of the bleed-out tongue 188 prevents it from interfering with the wirebond lands 178, thereby allowing placement of the wirebond lands 178 close to the microelectronic die 182.

The radiation curable adhesive material 176 may include, but is not limited to the following, epoxies, acrylates, silicones, urethane acrylates, cyanoacrylates, bismaleimides, and the like. The radiation may include, but is not limited to, ultraviolet light, ultraviolet-visible light (e.g., near ultraviolet), or electron-beam (E-beam).

In one embodiment, the radiation curable underfill material 176 is an epoxy adhesive, for example, Loctite® 3338 from Loctite Corporation, Rocky Hill, Conn., USA, which is dispensed on the substrate first surface 174. The microelectronic die 182 is placed on the radiation curable adhesive material 176 with certain pressure to wet the microelectronic die back surface 184 and spread the radiation curable adhesive material 176. Immediately after the microelectronic die 182 is attached, the construction is exposed to ultraviolet light source such as a Fusion Model LC-6B Benchtop Conveyor from Fusion UV Systems, Inc of Gaithersburg, Md., USA. The typical ultraviolet cure conditions are an exposure time of about 30 seconds to a lamp source Fusion "D" bulb, Hg arc, or a metal halide bulb with an irradiance of between about 50 and 100 mW/cm$^2$. The wavelength of the ultraviolet light is between about 310 and 365 nm. A post-cure of between about 30 and 60 minutes at about 100° C. can be applied to fully cure the radiation curable adhesive material 176.

The illustrated embodiment of FIGS. 13 and 14 shows the radiation curable adhesive material 176 applied to the substrate active surface 174, then the placement of the microelectronic die 182 on the radiation curable adhesive material 176. However, it is, of course, understood that the radiation curable adhesive could be applied to the microelectronic die back surface 184 and then placed on the substrate active surface 174.

Figure 15:
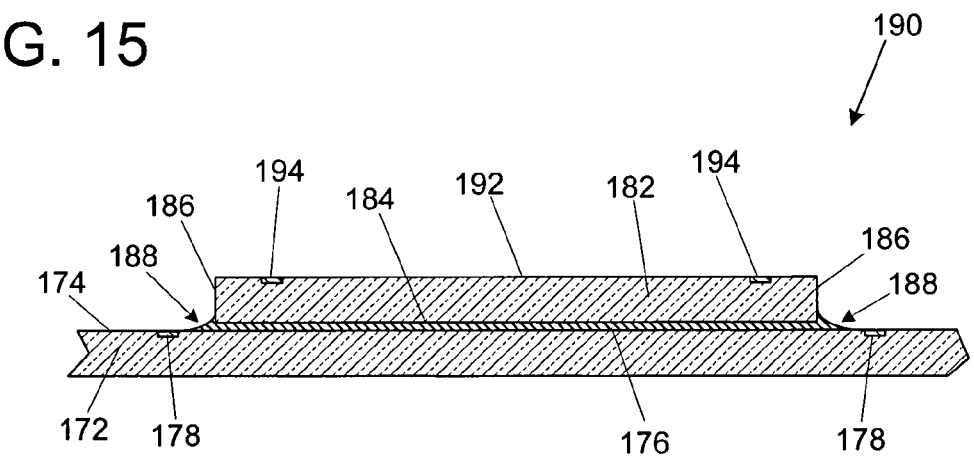
FIG. 15 is a side cross-sectional view of the structure of FIG. 14, after curing of the adhesive material, according to the present invention.
Figure 16:
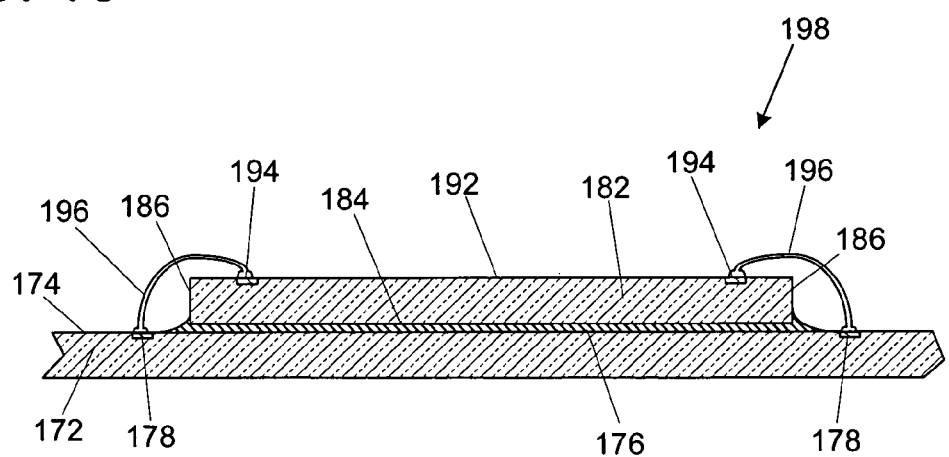
FIG. 16 is a side cross-sectional view of the structure of FIG. 15 having wirebonds electrically connecting bond pads on an active surface of the wirebond microelectronic die to the substrate wirebond lands, according to the present invention.
Figure 17:
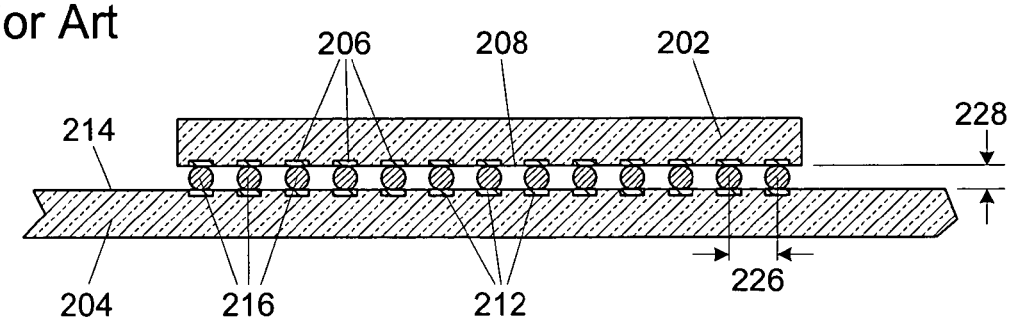
FIG. 17 is a side cross-section view of a microelectronic die attached to a substrate, as known in the art.
Figure 18:
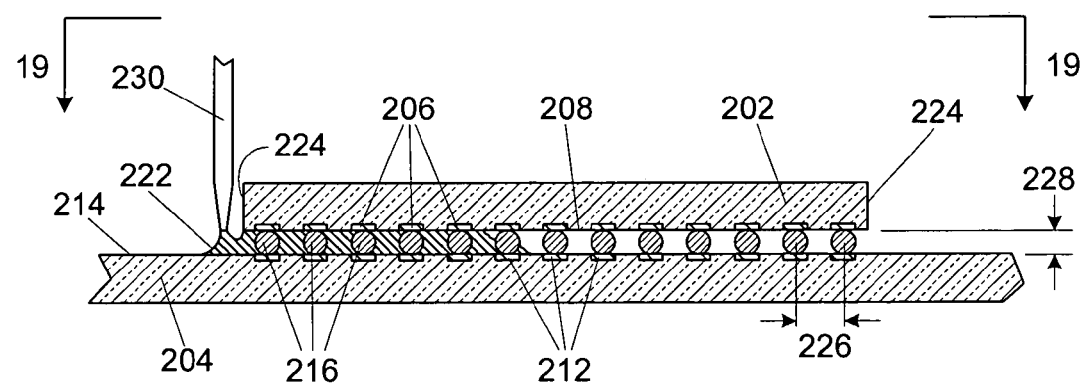
FIG. 18 is a side cross-sectional view of a needle dispensing an underfill material proximate a side of the microelectronic die of FIG. 17, as known in the art.
Figure 19:
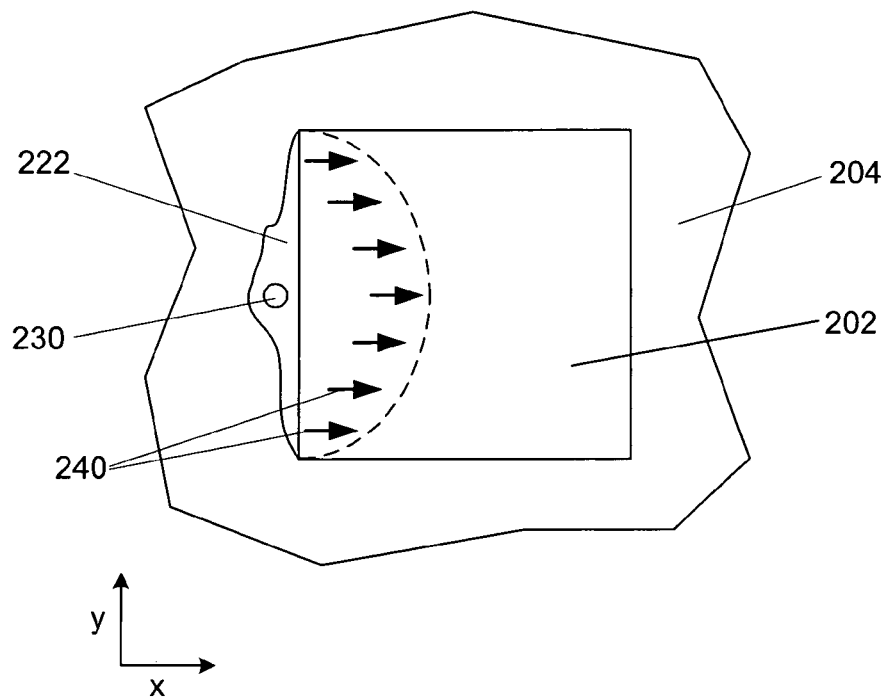
FIG. 19 is a top plan view of the structure of FIG. 18 along line 19—19 of FIG. 18, as known in the art.
Figure 20:
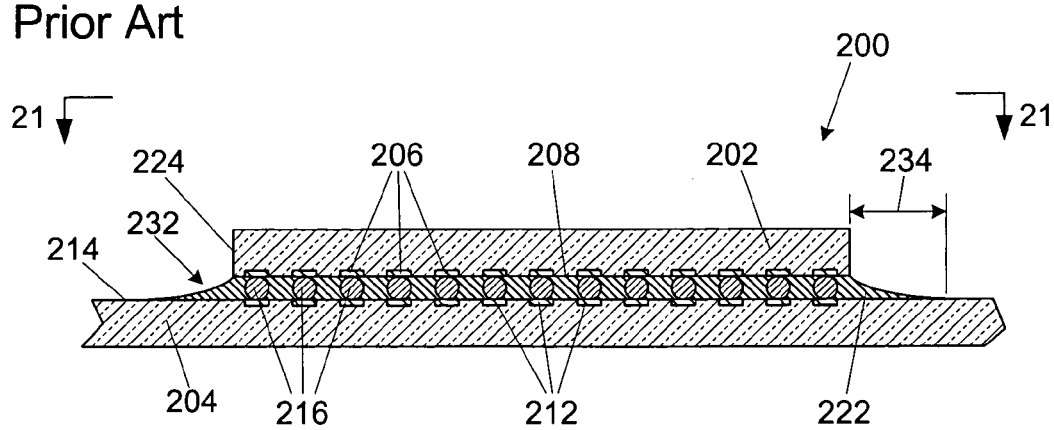
FIG. 20 is a side cross-sectional view of the structure of FIG. 17 after the underfill material had been dispensed, as known in the art.
Figure 21:
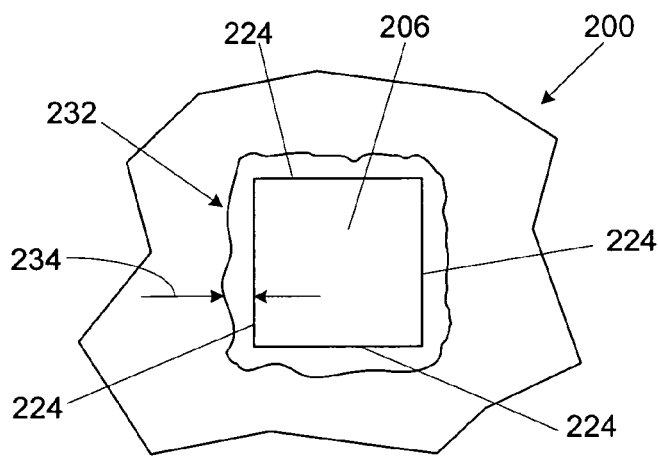
FIG. 21 is a top plan view of the structure of FIG. 20 along line 21—21 of FIG. 20, as known in the art.
Figure 22:
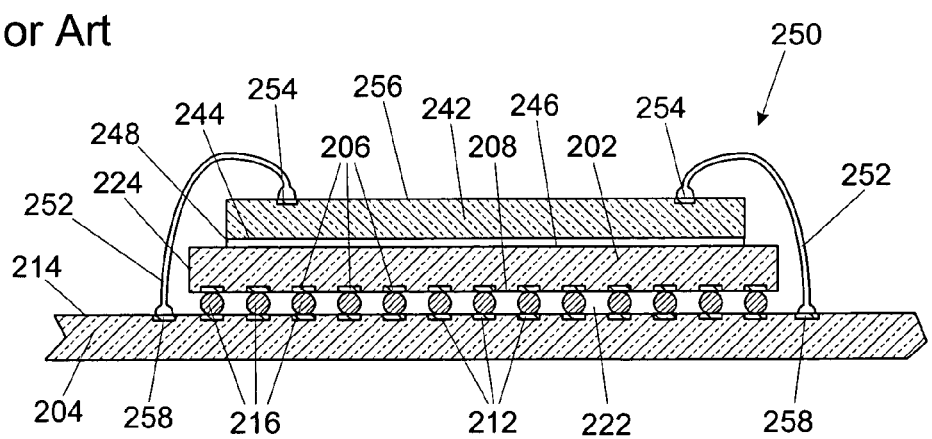
FIG. 22 is a side cross-sectional view of the structure of FIG. 17, wherein a second microelectronic die attached by a back surface to a back surface of the microelectronic die and having wirebonds electrically connecting bond pads on an active surface of the second microelectronic die to the substrate wirebond lands, as known in the art.
Figure 23:
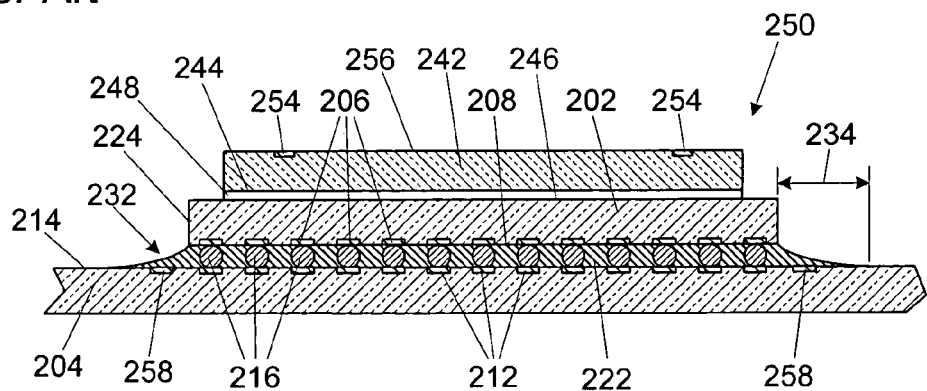
FIG. 23 is a side cross-sectional view of the structure of FIG. 17, wherein a second microelectronic die attached by a back surface to a back surface of the microelectronic die and having an underfill material disposed between the microelectronic die and the substrate, as known in the art.
Figure 24:
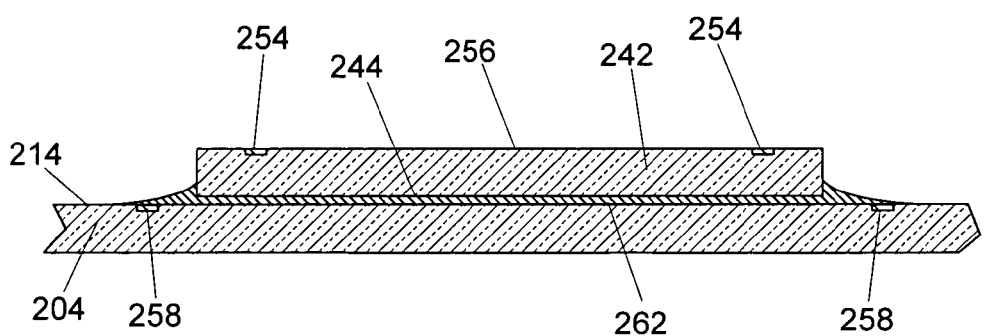
FIG. 24 is a side cross-sectional view of a wirebond microelectronic die having an adhesive material disposed between the wirebond microelectronic die and the substrate, as known in the art.

The radiation curable adhesive material 176 is then cured (usually heated to solidify the adhesive material), resulting in an intermediate microelectronic package 190, as shown in FIG. 15. As shown in FIG. 16, at least one wirebond 196 makes electrical contact between at least one land 194 on an active surface 192 of the microelectronic die 182 and at least one wirebond land 178 on the substrate 172 to form a microelectronic package 198.

It is, of course, understood that additional steps and fabrication could be undertaken, including mold/encapsulation of the microelectronic package 170 of FIG. 12 or microelectronic package 198 of FIG. 16, attachment of heat dissipation devices, the formation of multi-stack packages, and the like.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package, comprising:
   providing a substrate having a surface and a plurality of lands disposed on said surface;
   providing a microelectronic die having an active surface, at least one edge, and a plurality of pads disposed on said active surface in a corresponding relationship to said plurality of substrate lands;
   contacting said plurality of substrate lands to said plurality of corresponding microelectronic die pads with a plurality of conductive bumps;
   disposing a radiation curable underfill material between said microelectronic die active surface and said substrate surface;
   exposing said substrate and said microelectronic die to radiation to partially cure said radiation curable underfill material during disposition thereof; and
   heating said conductive bumps and said radiation curable underfill material to reflow said conductive bumps and to completely cure said radiation curable underfill material.

2. The method of claim 1, wherein exposing said substrate and said microelectronic die to radiation comprises exposing said substrate and said microelectronic die to radiation substantially simultaneously with said disposing a radiation curable underfill material between said microelectronic die active surface and said substrate surface.

3. The method of claim 1, wherein disposing a radiation curable underfill material comprises disposing an ultraviolet radiation curable underfill material between said microelectronic die active surface and said substrate surface.

4. The method of claim 3, wherein disposing a radiation curable underfill material comprises disposing a material selected from the group consisting of epoxies, acrylates, silicones, urethane acrylates, cyanoacrylates, and bismaleimides.

5. The method of claim 1, wherein exposing said substrate and said microelectronic die to radiation comprises exposing said substrate and said microelectronic die to ultraviolet radiation.

6. The method of claim 1, further including attaching a back surface of a second microelectronic device to a back surface of said microelectronic die.

7. The method of claim 6, further including attaching at least one wirebond extending between at least one land on an active surface of said second microelectronic device and at least one wirebond land on said substrate.

8. A method of fabricating a microelectronic package, comprising:
   providing a substrate having a surface and a plurality of lands disposed on said surface;
   providing a microelectronic die having an active surface, an opposing back surface, and at least one land disposed on said microelectronic die active surface;
   attaching said microelectronic die back surface to said substrate active surface with a radiation curable adhesive material; and
   exposing said substrate and said microelectronic die to radiation simultaneously with said attaching said microelectronic die back surface to said substrate active surface.

9. The method of claim 8, wherein attaching said microelectronic die back surface to said substrate surface comprises disposing said radiation curable adhesive material on said substrate active surface and placing said microelectronic die back surface to said radiation curable adhesive material.

10. The method of claim 9, wherein attaching said microelectronic die back surface to said substrate surface comprises disposing an ultraviolet radiation curable adhesive material on said substrate active surface and placing said microelectronic die back surface to said ultraviolet radiation curable adhesive material.

11. The method of claim 8, wherein disposing a radiation curable adhesive material comprises disposing an ultraviolet radiation curable adhesive material between said microelectronic die back surface and said substrate active surface.

12. The method of claim 11, wherein disposing a ultraviolet radiation curable adhesive material comprises disposing a material selected from the group consisting of epoxies, acrylates, silicones, urethane acrylates, cyanoacrylates, and bismaleimides.

13. The method of claim 8, wherein exposing said substrate and said microelectronic die to radiation comprises exposing said substrate and said microelectronic die to ultraviolet radiation.

14. The method of claim 8, further including attaching at least one wirebond extending between at least one land on said active surface microelectronic device and at least one wirebond land on said substrate.

* * * * *